Nov. 18, 1969 J. PRITULSKY 3,479,634

PRINTED CIRCUIT BOARD CONNECTORS

Filed Oct. 25, 1967 2 Sheets-Sheet 1

Nov. 18, 1969 J. PRITULSKY 3,479,634

PRINTED CIRCUIT BOARD CONNECTORS

Filed Oct. 25, 1967 2 Sheets-Sheet 2

United States Patent Office 3,479,634

Patented Nov. 18, 1969

3,479,634

PRINTED CIRCUIT BOARD CONNECTORS

James Pritulsky, Harrisburg, Pa., assignor to AMP Incorporated, Harrisburg, Pa.

Filed Oct. 25, 1967, Ser. No. 678,001
Int. Cl. H05k *1/07;* H01r *13/50, 11/08*
U.S. Cl. 339—17 5 Claims

ABSTRACT OF THE DISCLOSURE

An interconnection system is disclosed with various connector designs for electrically connecting conductors to printed circuit boards or the like. In one form the connector receives wire conductors and endwise receives a printed circuit board to function as an edge connector for the board. In another form the connector receives wire conductors and is either receivable within an aperture in a printed circuit board or may receive two printed circuit boards end to end to function as edge connectors for each board.

Background of the invention

*Field of the invention.*—The invention is for use in the electrical field for connecting various components in a modular system. The connectors have general utility and are not restricted to the specific system shown in the drawings.

*Description of the prior art.*—U.S. Patents Nos. 3,060,402 and 3,156,517 disclose solder well terminals which perform a portion of the functions performed by the instant connectors; however, the structural differences between the prior art and the instant connector permit the latter to have extreme versatility in various modular arrangements.

Summary of the invention

The connector has inwardly directed prongs or lances for receiving and holding wire conductors. The connector is adapted to be dip soldered to electrically unite the connector and conductors. The connectors have spring contact arms which receive printed circuit boards and make electrical contact with the circuitry on the board. The connectors thus function as edge connectors in an electrical system.

Brief description of the drawing

FIGURE 1 is a perspective view of a modular system employing the teachings of the present invention;

FIGURE 2 is a perspective view of a first form of connector usable, for example, in the system shown in FIGURE 1;

FIGURE 3 is a side elevational view of the connector of FIGURE 2 shown in position on a mounting member and receiving a printed circuit board or the like;

FIGURE 4 is a cross-sectional view taken along the line 4—4 of FIGURE 5 and showing internal details of the connector;

FIGURE 5 is a cross-sectional view taken along the line 5—5 of FIGURE 4 showing further details;

Description of the preferred embodiments

The attainments of the present invention will become apparent to those skilled in the art upon a reading of the following detailed description when taken in conjunction with the drawings in which there are shown and described illustrative embodiments of the invention; it is to be understood, however, that these embodiments are not intended to be exhaustive nor limiting of the invention but are given for purpose of illustration in order that others skilled in the art may fully understand the invention and the principles thereof and the manner of applying it in practical use so that they may modify it in various forms, each as may be best suited to the conditions of the particular use.

Figures 1, 2, 3, 4, 5:
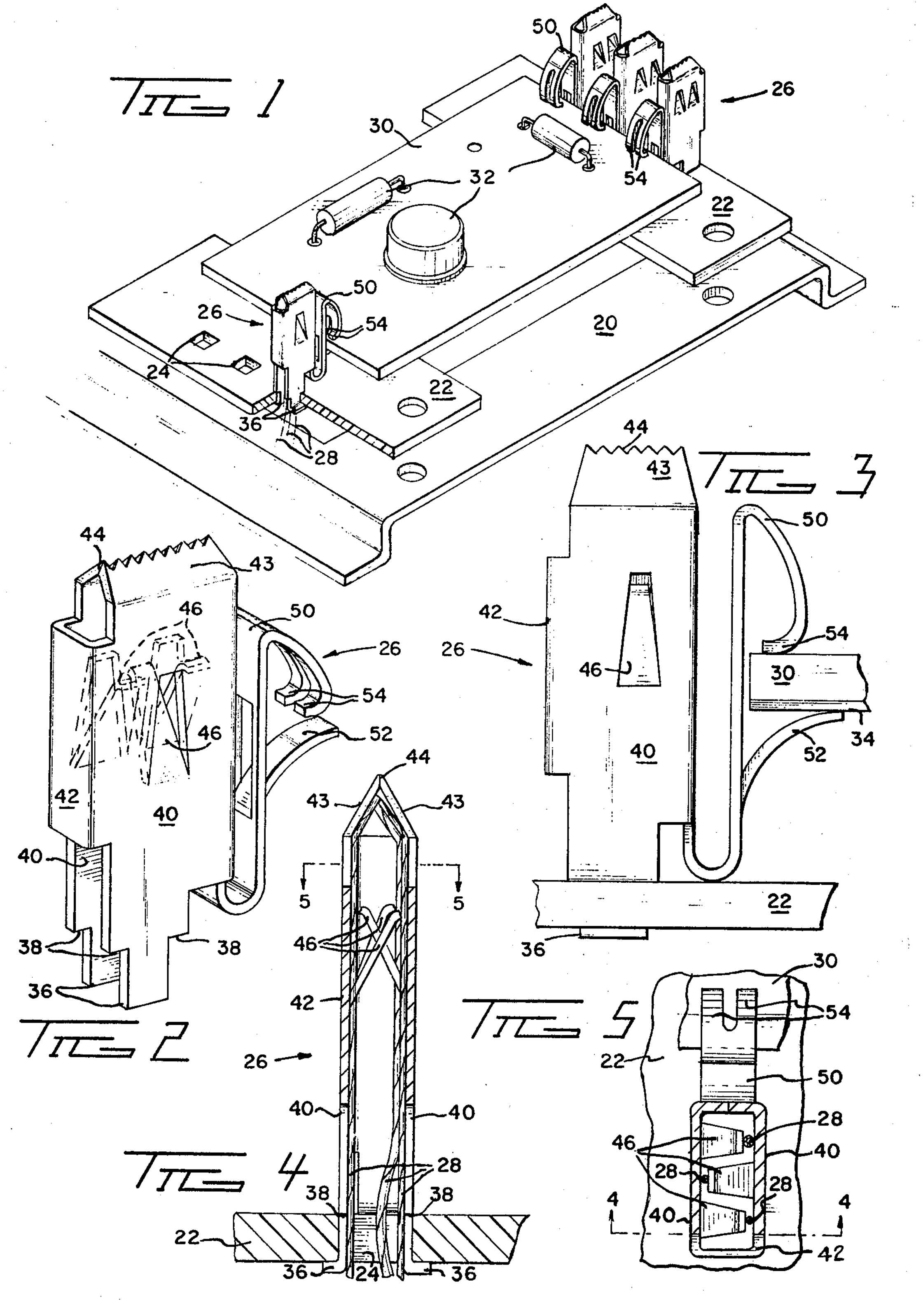

In FIGURE 1 there is shown a modular system which may be a portion of a television or radio receiver or the like. A chassis 20 is shown having provision for mounting insulating blocks 22. The blocks 22 have a series of apertures 24 disposed therealong for receiving electrical connectors indicated generally at 26. The connectors 26 receive wire conductors 28 and function as edge connectors for a printed circuit board or the like 30, the board having electrical components 32 on its upper surface and printed circuit strips 34 (FIGURE 3) on its lower surface.

The connectors 26 will now be described in detail with particular reference to FIGURES 2–5. A pair of legs 36 extend from the lower portion of the connector and are insertable within the apertures 24 in the insulating board 22. The legs 36 are subsequently bent in order to secure the connector to the board. Shoulder means 38 is positioned directly above the legs and serves to position the connectors on the insulating board. Each connector is preferably formed from a single flat sheet of metal which is formed into the configuration substantially as shown in FIGURE 2. The connector comprises a pair of generally parallel side wall portions 40 joined by a strap member 42. The side portions 40 converge at their ends 43 and join in a seam 44 having openings therein for permitting dip soldering as will become apparent.

A plurality of contact lances 46 are struck from the sides 40 of the connector, the number of such lances being variable according to the conditions of a particular use. Each lance 46 is cooperable with an inside surface of the sides 40 for retaining a wire conductor therebetween. In FIGURES 4 and 5 there are shown three wire conductors 28 positioned within the connector, each conductor being held individually by a particular contact lance. It can be seen that the conductors 28 may vary in size due to the individual contact action. When the conductors are all in place the connector will be dip soldered by placing the edge 44 in a solder bath causing the solder to wick through the connector thus forming a solid electrical union between the conductors and the connector.

A contact arm 50 extends from one side of the connector opposite to the strap 42. The arm 50 has a contact member 52 struck therefrom and the arm terminates in a pair of spring contacts 54. The contact arm is arranged so as to receive an edge of a printed circuit board or the like between the contacts 52 and 54. The upper members 54 will engage the upper surface of the printed circuit board to hold the board in place while the lower member 52 will contact the circuitry on the board to complete the electrical connection between the circuitry strips on the board and the wire conductors 28. The modular arrangement shown in FIGURE 1 is one of many possible configurations in which the connectors 26 may be utilized. As seen in FIGURE 1 the board 30 is placed between two rows of connectors 26 thereby providing for edge connectors at two opposite sides of the board. During insertion of the board 30 between the rows of connectors the upper portions 54 of the contact arms will be deflected to permit entrance of the board and will later spring back into position on the upper surface of the boards.

Figures 6, 7, 8, 9, 10:
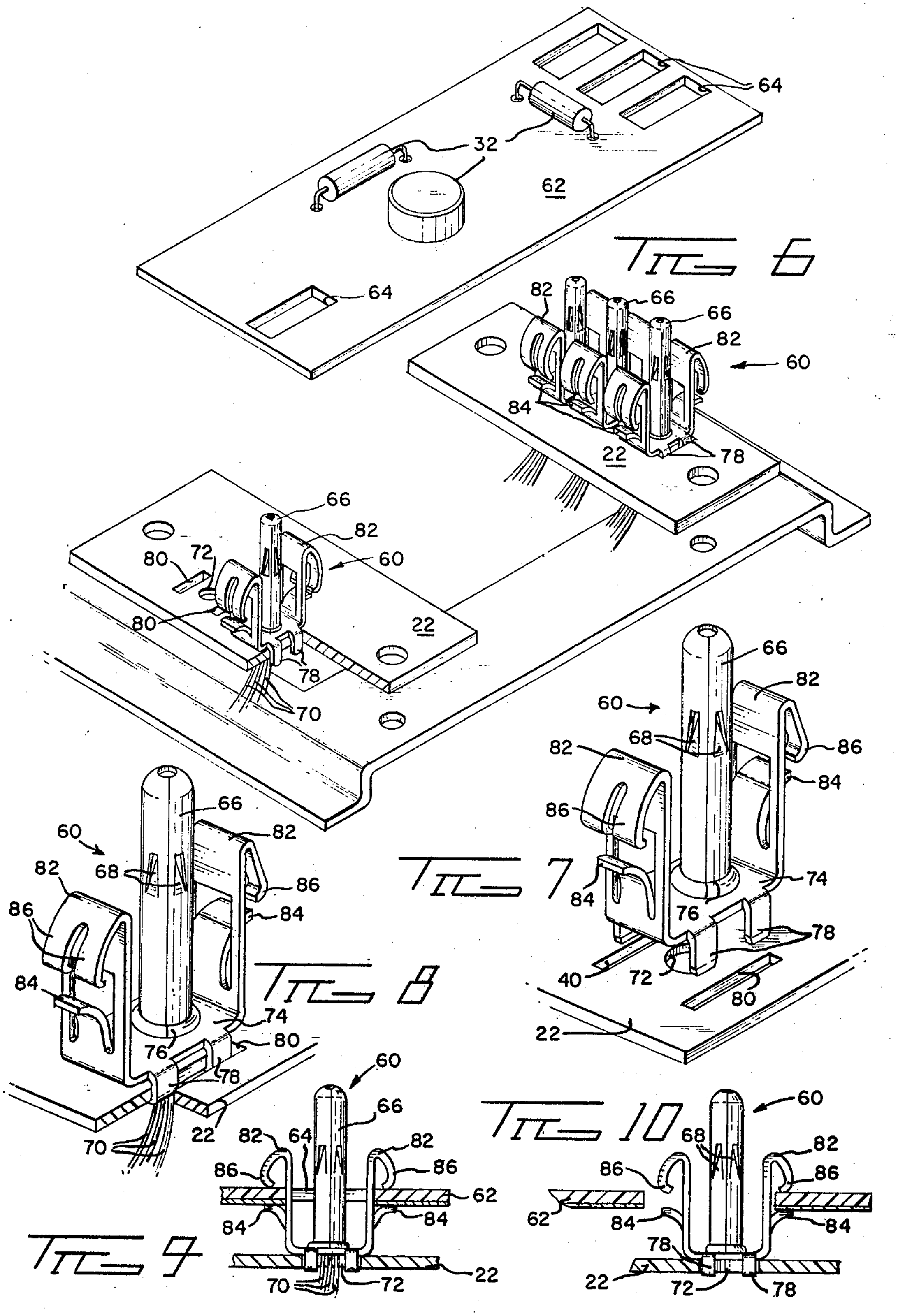
FIGURE 6 is a perspective view of a modular system employing an alternative form of connector.
FIGURE 7 is a perspective view of a connector usable in the system of FIGURE 6, the connector being exploded from its mounting member.
FIGURE 8 is a perspective view similar to FIGURE 7 and showing the connector in position on a mounting member and receiving conductors.
FIGURE 9 is a side elevational view partly in section showing the connector in position within an aperture in a printed circuit board.
FIGURE 10 is a side elevational view partly in section showing the connector receiving two printed circuit boards end to end.

In FIGURE 6 a modular system is shown which is similar to that shown in FIGURE 1 with the exception that an alternative form of connector 60 is employed. The connectors 60 are mounted on the insulating board 22 in the same manner as the connectors 26 previously described. A printed circuit board 62 is to be received by the connectors 60 for electrical connection therewith. The board 62 is somewhat different from the board 30 previously described in that the board 62 has rectangular apertures 64 disposed therein, which apertures are adapted to be placed directly over the connectors 60 all as will become apparent as the description proceeds.

The connectors 60 are best shown in FIGURES 7 through 10. A central portion 66 is provided and has a plurality of lances 68 disposed therearound, which lances act in the same manner as the lances 46 of the connectors 26. Electrical conductors 70 are insertable through an aperture 72 in an insulating board 22 and are received within the central member 66 and held in place by the lances 68. The member 66 is then dip soldered to complete the electrical connection in the same manner as previously described.

The connectors 60 are formed from two separate units, one being the central member 66 and the other being the contact portions indicated generally at 74. The two parts are connected at 76 by suitable means such as welding, brazing, etc. A pair of legs 78 extend from each side of the lower portion of the connector and are inserted through slots 80 in the member 22 for securing the connector to the member. A pair of contact arms 82 extend in generally parallel relation, one arm being disposed on opposite sides of central member 66 from the other arm. Each arm 82 is formed similarly to the arms 50 previously described in connection with connector 26 in that the arm has a lower contact portion 84 and upper spring portions 86, the portions 86 serving to engage the upper surface of the printed circuit board 62 while the lower member 84 serves to engage the circuitry on the lower surface of the board.

The connector 60 may be inserted through an aperture in a printed circuit board such as shown in FIGURE 6 to thereby connect with the circuitry on the board. Also, the connector may be positioned as shown in FIGURE 10 whereby two boards are joined by the connector 60, the connector serving as an edge connector in the same manner as the previously described connectors 26. In this way the connectors 60 are extremely versatile and permit wide variation in modular configuration.

Changes in construction will occur to those skilled in the art and various apparently different modifications and embodiments may be made without departing from the scope of the invention. The matter set forth in the foregoing description and accompanying drawings is offered by way of illustration only. The actual scope of the invention is intended to be defined in the following claims when viewed in their proper perspective against the prior art.

I claim:

1. An electrical connector comprising an elongated body member of substantially closed configuration, said member having means at one end thereof for securing said member to a mounting means, said member further having contact means extending internally thereof, said contact means being cooperable with an internal surface of said body member for retaining a conductor therebetween, said connector having means at said one end thereof for receiving a conductor, and a contact arm extending from said body member, said arm having contact fingers extending therefrom, said fingers being cooperable for receiving a circuit board therebetween and for making electrical connection with said board.

2. An electrical connector as set forth in claim 1 wherein said fingers are disposed for receiving said board at right angles to said conductor.

3. An electrical connector comprising an elongated body member of substantially closed configuration, said member having means at one end thereof for securing said member to a mounting means, said member further having contact means extending internally thereof, said connector having means at said one end thereof for receiving a conductor, and contact arms extending from each of opposite sides of said body member, each said arm having contact fingers extending therefrom for receiving a circuit board.

4. An electrical connector as set forth in claim 3 wherein said contact arms are disposed in parallel relation and are adapted to be received within an aperture in said printed circuit board.

5. An electrical connector as set forth in claim 3 wherein said contact fingers are disposed for receiving printed circuit boards at right angles to said conductor.

References Cited

UNITED STATES PATENTS

| | | |
|---|---|---|
| 2,503,559 | 4/1950 | Miloche. |
| 2,830,278 | 4/1958 | Schwarz. |
| 3,060,402 | 10/1962 | Olsson et al. |
| 3,173,737 | 3/1965 | Kinkaid et al. |
| 3,408,611 | 10/1968 | Katz. |

MARVIN A. CHAMPION, Primary Examiner

P. A. CLIFFORD, Assistant Examiner

U.S. Cl. X.R.

339—176, 275